(12) United States Patent  
Jain

(10) Patent No.: US 6,579,666 B2  
(45) Date of Patent: Jun. 17, 2003

(54) METHODOLOGY TO INTRODUCE METAL AND VIA OPENINGS

(75) Inventor: Ajay Jain, Hillsboro, OR (US)

(73) Assignee: Intel Corportion, Santa Clara, CA (US)

( * ) Notice: Subject to any disclaimer, the term of this patent is extended or adjusted under 35 U.S.C. 154(b) by 125 days.

(21) Appl. No.: 09/750,853

(22) Filed: Dec. 27, 2000

(65) Prior Publication Data

US 2002/0081531 A1 Jun. 27, 2002

(51) Int. Cl.[7] .............................. G03F 7/00; G03F 7/26
(52) U.S. Cl. .................. 430/316; 430/311; 430/312; 430/313; 430/317; 430/323; 430/328; 430/329
(58) Field of Search ................................. 430/311, 312, 430/313, 314, 317, 328, 329, 323

(56) References Cited

U.S. PATENT DOCUMENTS

| | | | |
|---|---|---|---|
| 5,143,820 A | * | 9/1992 | Kotecha et al. ............. 430/314 |
| 5,741,624 A | * | 4/1998 | Jeng et al. .................. 430/312 |
| 6,107,011 A | * | 8/2000 | Gelbart ........................ 430/397 |
| 6,221,680 B1 | * | 4/2001 | Hakey et al. .................. 438/8 |
| 2002/0081531 A1 | * | 6/2002 | Jain ............................ 430/322 |
| 2002/0081532 A1 | * | 6/2002 | Jain ............................ 430/322 |

* cited by examiner

*Primary Examiner*—Mark F. Huff  
*Assistant Examiner*—Nicole Barreca  
(74) *Attorney, Agent, or Firm*—Blakely, Sokoloff, Taylor & Zafman LLP

(57) ABSTRACT

A method comprising introducing a photoimageable material on a substrate; developing the photoimageable material over an opening area, the photoimageable material over a first portion of the opening area developed to a first extent and the photoimageable material over a second portion of the opening area developed to a different second extent; removing developed photoimageable material from the opening area; and forming an opening in the substrate in the opening area.

14 Claims, 2 Drawing Sheets

METHODOLOGY TO INTRODUCE METAL AND VIA OPENINGS

BACKGROUND OF THE INVENTION

1. Field of the Invention

The invention relates to integrated circuit processing and, more particularly, to the introduction and patterning of interconnections on an integrated circuit.

2. Description of Related Art

Modern integrated circuits use conductive interconnections to connect the individual devices on a chip or to send and/or receive signals external to the chip. Popular types of interconnections include aluminum alloy interconnections (lines) and copper interconnections (lines) coupled to individual devices, including other interconnections (lines) by interconnections through vias.

One method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, refractory materials include titanium nitride (TiN) or tantalum (Ta). The barrier layer serves, in one aspect, to inhibit the diffusion of the interconnection material that will subsequently be introduced in the via and trench into the dielectric. Next, a suitable seed material is deposited on the wall or walls of the via and trench. Suitable seed materials for the deposition of copper interconnection material include copper (Cu) and nickel (Ni). Next, interconnection material, such as copper, is introduced by electroplating or physical deposition in a sufficient amount to fill the via and trench and complete the interconnection structure. Once introduced, the interconnection structure may be planarized and a dielectric material (including an interlayer dielectric material) introduced over the interconnection structure to suitably isolate the structure.

In forming the via and trench for the interconnection structure, current techniques employ masking and etching operations. A first mask and etch define the via opening. Once formed, a second mask and etch is used to form the trench opening. These masking and etching operations may be reversed. Regardless, two mask and etch operations are generally required.

One problem with two mask and etch operations for defining an interconnection structure is that it is a multi-step operation to form the opening (i.e., via and trench opening). In other words, separate masks (reticles) must be formed; separate introduction and development of masking materials such as photoresist must be used; and separate etching operations to form the via and trench, respectively, must be performed.

What is needed are techniques for improving the introduction of an interconnection structure.

DETAILED DESCRIPTION

An improved method of forming an interconnection structure is disclosed. In one embodiment, the method includes introducing a photoimageable material on a substrate and developing the photoimageable material over an opening area. The photoimageable material of a first portion of the opening area is developed to a first extent and the photoimageable over a second portion of the opening area is developed to a different second extent. Developed photoimageable material is removed from the opening area and an opening in the substrate is formed in the opening area. In terms of forming an opening for an interconnection structure, the substrate may comprise a dielectric material overlying a contact point such as a circuit device or an underlying interconnection. In one example, the photoimageable material over the second portion of the opening area is developed to a lesser extent than the photoimageable material over the first portion of the opening area. Forming the opening in the dielectric material comprises forming the opening to a depth less than necessary to expose a contact point then removing the photoimageable material over the second portion of the opening area and exposing the contact point. In this manner, both a trench and via, for example, may be formed with a single mask or reticle.

Figure 1:
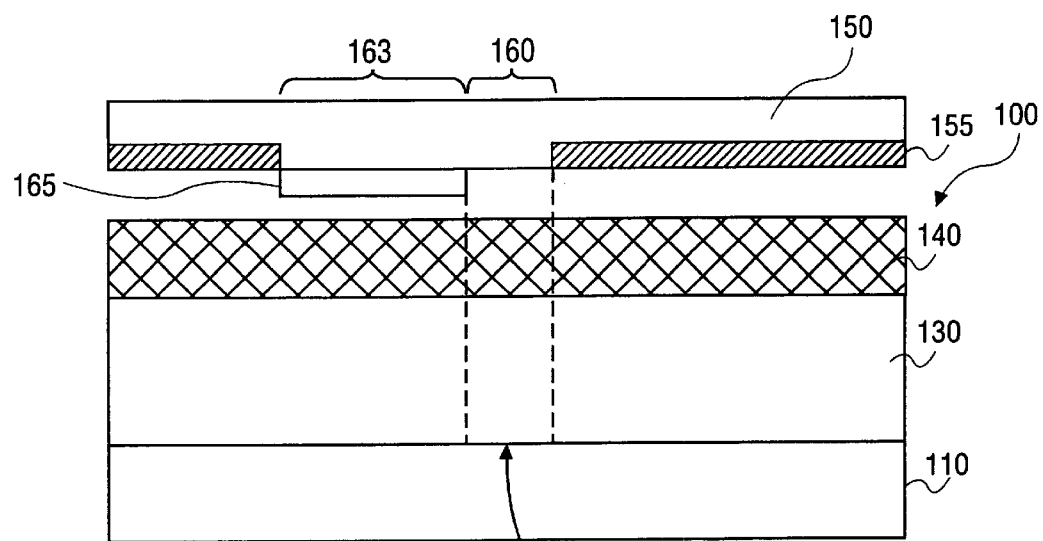
FIG. 1 shows a schematic, cross-sectional side view of a substrate comprising a dielectric layer and photoimageable material introduced over the dielectric layer, and a mask or reticle having an opening to a desired contact point according to an embodiment of the invention.

FIG. 1 shows a typical circuit structure, such as a portion of a microprocessor chip on a silicon wafer. A typical integrated circuit such as a microprocessor chip may have, for example, four or five interconnection layers and levels separated from one another by a dielectric material. In FIG. 1, structure 100 includes substrate 110 that may be the wafer substrate having circuit devices, including transistors, thereon as well as one or more layers or levels of interconnection to devices. FIG. 1 shows contact point 120 that may be a circuit device formed on and/or in a wafer or an interconnection line formed above the wafer to devices on the wafer. It is to be appreciated that the techniques described herein may be used for various interconnections within an integrated circuit including circuit devices and other interconnections. In this sense, contact point 120 represents such devices wherein an interconnection contact is made.

Overlying substrate 110 and contact point 120 is dielectric material 130. Dielectric material 130 is, for example, silicon dioxide ($SiO_2$) formed by tetraethyl orthosilicate (TEOS) or a plasma enhanced chemical vapor deposition (PECVD) source. Dielectric material 130 may also be a material having a dielectric constant less than the dielectric constant of $SiO_2$ (e.g., a "low k" material), including polymers is known in the art.

Referring to FIG. 1, structure 100 is prepared for a patterning operation, specifically a photolithography operation to define an opening through dielectric material 130 to contact point 120. FIG. 1 describes a photolithography process using a positive photoresist methodology. A relatively non-soluble photoresist material 140 is introduced over dielectric material 130 such as, for example, by a spinning process as known in the art. It is to be appreciated that the surface of dielectric material 130 that is to receive dielectric material 140 may be prepared as known in the art before the introduction of dielectric material 140. For example, the surface of dielectric material 130 may be exposed to a low-temperature dehydration bake (e.g., a bake in the range of a 150 to 200° C.) and priming with, for example, hexamethyldisilazane (HMDS).

Following the introduction of photoresist material 140, field mask 150 is aligned over structure 100 defining an opening area 162 for light exposure to contact photoresist material 140 and encode an image in photoresist material 140. Field mask 150 is, for example, a glass (e.g., borosilicate glass or quartz) material having chrome layer 155 introduced thereon to define opening 162. Field mask 150 may also include a phase shift material as known in the art for use in sharpening the definition of openings formed in photoresist material.

In this embodiment, field mask 150 also includes absorption layer 165 introduced through a portion of opening area 162. Absorption layer 165 is selected to be a material, in one embodiment, that allows some light exposure through portion 163 of opening area 162 to partially solubilize photoresist material 140 defined in the area corresponding to portion 163 in opening area 162. A suitable material and thickness for absorption layer 165 will be dependent on the wavelength of the light source.

Having properly aligned light field mask 150 over structure 100, the structure is exposed to a light source, such as an ultraviolet light source. In this embodiment, the light source changes the chemical structure of photoresist material 140 from relatively non-soluble to much more soluble. Following light exposure, a developer, such as tetramethyl ammonium hydroxide, may be used to remove the solubilized photoresist material in opening area 162, while retaining the generally soluble photoresist material over the substrate in those areas that were not exposed to the light source.

Figure 2:
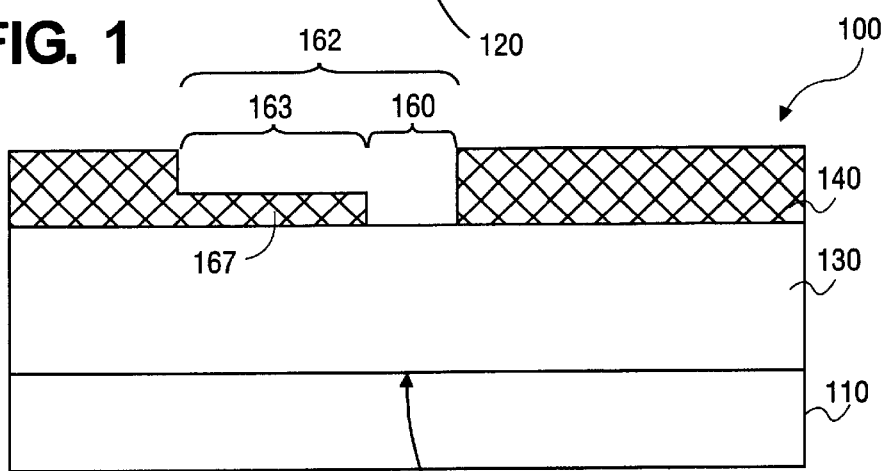
FIG. 2 shows the structure of FIG. 1 after developing a first portion of an opening area and partially developing a second portion an opening area.

FIG. 2 shows structure 100 after light exposure, removal of light field mask or reticle 150, and the introduction of a developer. As can be seen, the developer removes photoresist material 140 over portion 160 of opening area 162, portion 160 receiving the full intensity of the light exposure. Another portion of photoresist material 140 (portion 163) of opening area 162 receives less than the full intensity of light through opening area 162 as a result of absorption layer 165 absorbing some of the light intensity. Accordingly, FIG. 2 shows photoresist material 140 over portion 163 of opening area 162 that is partially developed. Thus, when the photoresist material was exposed to a developer, that portion of photoresist material in portion 163 of opening area 162 is not completely removed.

Figure 3:
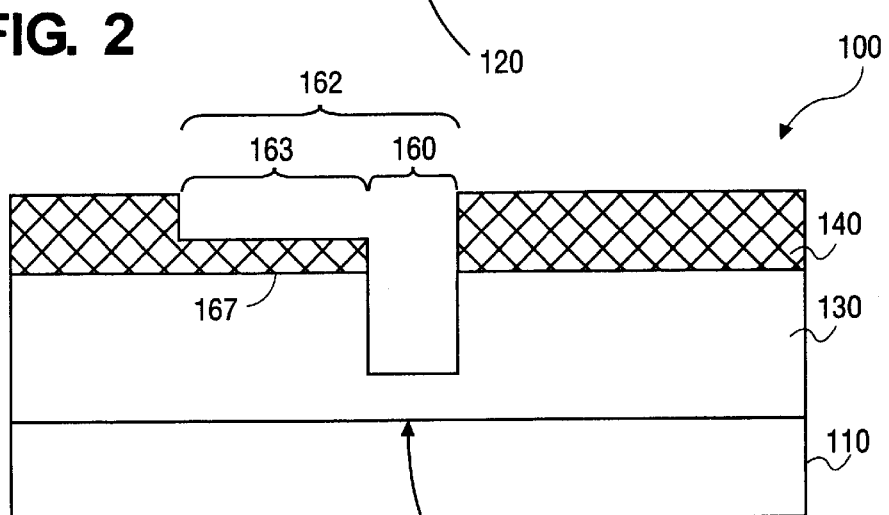
FIG. 3 shows the structure of FIG. 1 after forming an opening in the dielectric material to a depth less than necessary to expose a contact point.

Referring to FIG. 3, after defining opening area 162 through photoresist material 140; specifically defining portion 160 (fully developed) and portion 163 (partially developed) of opening area 162, the structure is subjected to an etch, such as a plasma etch, to form an opening in dielectric material 130. In the example where dielectric material 130 is $SiO_2$, a suitable plasma etch chemistry is $CH_3/CF_4$ or $C_4F_8$. As shown in FIG. 3, the etch of dielectric material 130 defines an opening that is less than necessary to expose contact point 120. In the embodiment described, the opening formed at this point represents a portion of a via opening in dielectric material 130. The via will be accompanied by an adjacent trench formed in dielectric material 130 according to a typical damascene process arrangement. Thus, in one embodiment, the etch is stopped where the depth of the opening in dielectric material 130 is equivalent to the thickness of the dielectric layer less an effective thickness (depth) for an opening for a subsequent trench.

Figure 4:
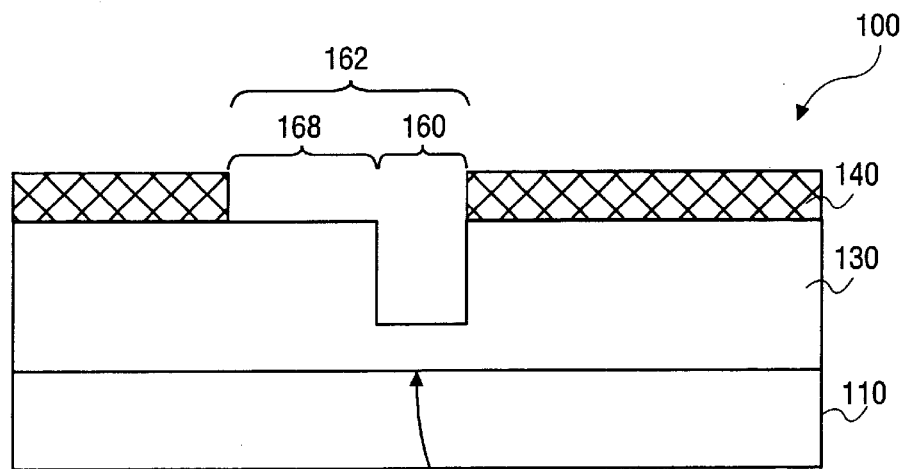
FIG. 4 shows the structure of FIG. 3 after removing the photoimageable material over the second portion of the opening area.

FIG. 4 shows the structure of FIG. 3 after the removal of partially developed portion 167 of photoresist material 140 in portion 163 of opening area 162. Partially developed photoresist material 167 may be removed by an etch process, such as an oxygen ashing, or a short exposure of structure 100 to a light source, such as an ultraviolet light source. One way the undeveloped material 167 may be exposed to a light source is by exposing structure 100 to a light source in the absence of a mask or reticle. Since photoresist material 167 is already partially developed, the amount of light energy required to complete the development will be less than necessary to develop (solubilize) the remaining portions of photoresist material 140. FIG. 4 shows structure 100 after the removal of partially developed photoresist material 167 with, for example, a developer following light exposure. As seen in FIG. 4, the opening area 162 now resembles an area for trench formation according to a conventional damascene process.

Figure 5:
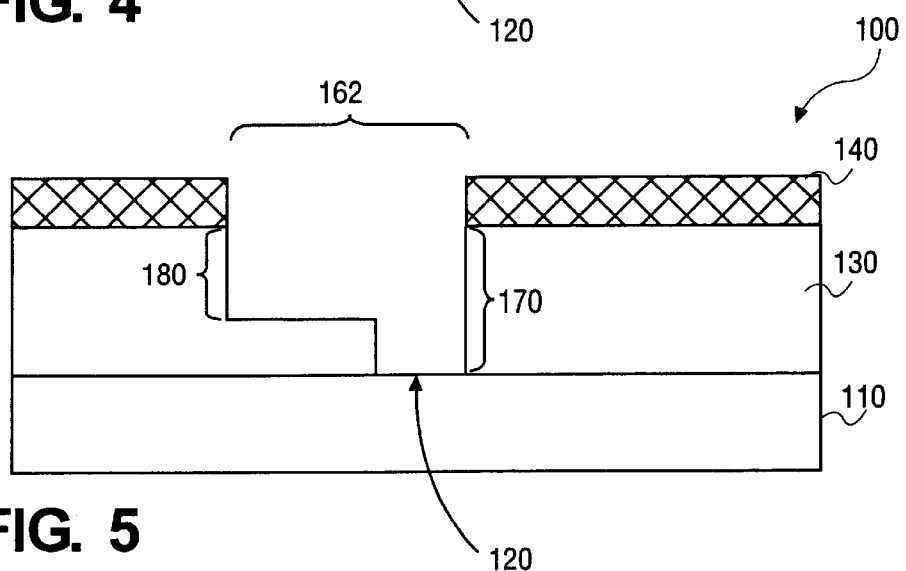
FIG. 5 shows the structure of FIG. 4 after forming an opening in the dielectric material to the contact point and defining a trench and a via over the contact point.

FIG. 5 shows the structure of FIG. 4 after an etch process (e.g., a plasma etch process) to define trench opening 180 in dielectric material 130. FIG. 5 also shows that this etch continues the earlier stopped etch of via 170. In one embodiment, the etch is sufficient to expose contact point 120 through dielectric material 130. It is to be appreciated that, in some instances, particularly where contact point 120 represents an underlying interconnection line, an etch stop material may overlie contact point 120. In such case, the opening to contact point 120 in forming the trench and via at this point is actually an etch to the etch stop, such as silicon nitride ($Si_3N_4$). A subsequent selective etch may be used to remove the etch stop material over contact point 120 without further etching the trench.

Figure 6:
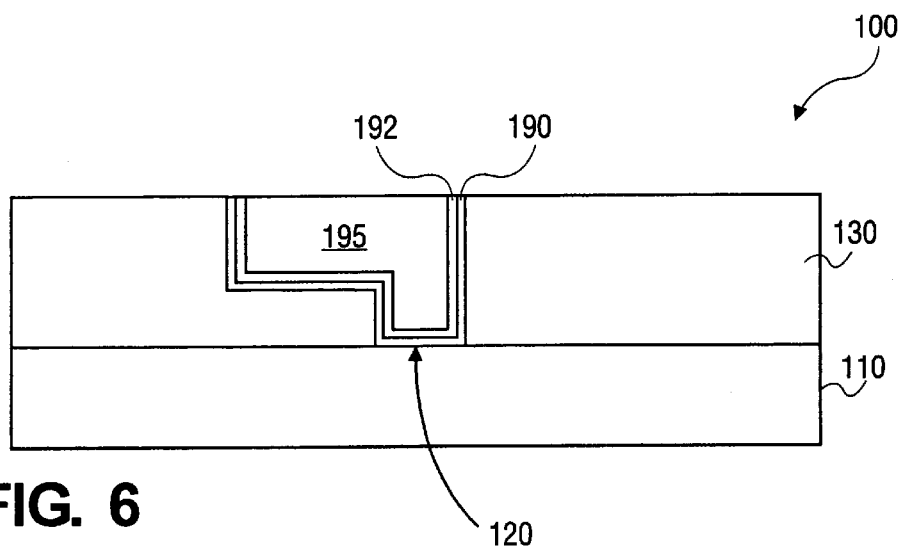
FIG. 6 shows the structure of FIG. 5 after the introduction of an interconnection structure in the opening in the dielectric material.

FIG. 6 shows the structure of FIG. 5 after the introduction of an interconnection structure. In this embodiment, the interconnection structure includes barrier material 190 of, for example, tantalum (Ta) or tantalum nitride (TaN). Interconnection structure also includes, in this embodiment, seed material 192 of, for example, a copper material and interconnection material 195 of, for example, copper. The structure is shown planarized with the surface of dielectric material 130. At this point, additional interconnection structures (e.g., lines) may be formed over the structure or, if the interconnection structure just formed represents the terminal interconnection line, suitable processing steps for encapsulating structure 100 may be introduced as known in the art.

In the preceding detailed description an improved methodology to introduce trench and via openings is presented. In one aspect, the definition of a trench and via used, for example, in a damascene process, may be defined in essentially a single masking operation by controlling the transfer of photoresist over a substrate to define a trench and via. It is appreciated that the demonstration of this technique with respect to interconnection patterning (specifically damascene process patterning) is representative of the invention as is the specific patterning technique described. The invention may find utility in any operation where, for example, multiple masking operations are typically required to form an opening in a material layer.

The invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

introducing a photoimageable material on a dielectric material overlying a contact point;

developing the photoimageable material over an opening area, the photoimageable material over a first portion of the opening area developed to a first extent and the photoimageable material over a second portion of the opening area developed to a lesser second extent;

removing developed photoimageable material from the opening area; and forming an opening in the dielectric material about the opening area to a depth equivalent to the thickness of the dielectric layer less an effective thickness for an opening about a second opening area;

removing photoimageable material over the second portion of the opening area; and after removing the photoimageable material, forming an opening in the dielectric material about the opening area to the contact point.

2. The method of claim 1, wherein developing the photoimageable material comprises developing through a single mask with a single exposure.

3. The method of claim 1, wherein developing the photoimageable material comprises:

exposing the photoimageable material over the opening area to light energy from a light source, wherein the photoimageable material over the first portion of the opening is exposed to more light energy than the photoimageable material over the second portion of the opening area.

4. The method of claim 1 further comprising forming an opening in the dielectric material about the second opening area and to a depth of about the effective thickness for an opening about a second opening area.

5. A method comprising:

introducing a photoimageable material over a dielectric material on a substrate;

developing the photoimageable material by exposing the photoimageable material to a light source through an optical mask;

defining an opening area in the photoimageable material, the opening area comprising a first portion exposing the dielectric material and a second portion retaining a portion of the photoimageable material;

retaining a third portion of the photoimageable material that is greater in thickness than the second portion retained portion of the photoimageable material; and forming an opening in the dielectric material defined by the opening area, wherein forming the opening in the dielectric comprises:

forming the opening to a depth equivalent to the thickness of the dielectric layer less an effective thickness for an opening about the second portion;

removing the retained photoimageable material over the second portion of the opening area, wherein removing the retained photoimageable material comprises:

exposing the photoimageable material of the first, second, and third portions to a light source in the absence of an optical mask, wherein the light source includes light energy sufficient to remove the retained photoimageable material over the second portion and retain a portion of the photoimageable material over the third portion; and after removing the photoimageable material, exposing the contact point.

6. The method of claim 5, wherein developing the photoimageable material comprises developing through a single mask with a single exposure.

7. The method of claim 5, wherein developing comprises:

prior to exposing the photoimageable material to a light source, introducing an energy absorbing material between the light source and the photoimageable material over the second portion of the opening area.

8. The method of claim 5, wherein the dielectric material overlies the contact point and exposing the contact point comprises forming a second opening to the contact point at the first portion.

9. The method of claim 5 wherein exposing the contact point comprises forming the opening about the second portion.

10. A method comprising:

developing a first portion of photoimageable material over an opening area of a dielectric material;

leaving undeveloped photoimageable material in a second portion of photoimageable material at a second area designated for an opening through a dielectric material;

retaining a third portion of photoimageable material that is greater in thickness than the second portion of photoimageable material;

forming a first opening in the area designated in the dielectric material at the first portion of photoimageable material, wherein the first opening is formed to a depth equivalent to the thickness of the dielectric material less a selected depth for a third opening in the dielectric material at the second portion;

after forming the first opening, removing the undeveloped photoimageable material at the second portion of photoimageable material; and after removing the undeveloped photoimageable material, forming a second opening in the dielectric material at the first portion of photoimageable material and the third opening in the dielectric material at the second portion of photoimageable material.

11. The method of claim 10, wherein forming the second opening comprises extending the first opening through the dielectric material to a contact point.

12. The method of claim 10, wherein developing comprises completely developing the first portion of the photoimageable material over the area designated.

13. The method of claim 10, wherein forming a first opening comprises forming an opening in a first portion of the area and forming the third opening comprises forming an opening in a second portion different than the first portion.

14. The method of claim 10, wherein developing the photoimageable material comprises developing through a single mask with a single exposure.

* * * * *